United States Patent [19]

Song

[11] Patent Number: 5,760,420
[45] Date of Patent: Jun. 2, 1998

[54] CONTACT LAYER OF A THIN FILM TRANSISTOR

[75] Inventor: Jin-Ho Song, Seoul, Rep. of Korea

[73] Assignee: Samsung Electronics Co., Ltd., Kyungki-Do, Rep. of Korea

[21] Appl. No.: 741,744

[22] Filed: Oct. 31, 1996

[30] Foreign Application Priority Data

Oct. 31, 1995 [KR] Rep. of Korea .............. 95-38697

[51] Int. Cl.$^6$ .............. H01L 29/04; H01L 31/036; H01L 31/0376; H01L 31/20
[52] U.S. Cl. .............. 257/57; 257/58; 257/59; 257/60; 257/61; 257/72
[58] Field of Search .............. 257/59, 61, 72, 257/60, 57, 58

[56] References Cited

U.S. PATENT DOCUMENTS

| | | | |
|---|---|---|---|
| 5,099,790 | 3/1992 | Kawakami | 118/728 |
| 5,308,778 | 5/1994 | Fitch et al. | 437/40 |
| 5,627,088 | 5/1997 | Fukaya et al. | 438/155 |

*Primary Examiner*—William Mintel
*Attorney, Agent, or Firm*—Cushman Darby & Cushman IP Group of Pillsbury Madison & Sutro LLP

[57] ABSTRACT

The effect of a TFT having a Ge—Si contact layer is that a stable etching of the contact layer, without excessive etching of the semiconductor layer can be made due to a good selectivity when etching. Consequently, a uniform channel after a backetch step is obtained and the device performance can be improved.

4 Claims, 2 Drawing Sheets

CONTACT LAYER OF A THIN FILM TRANSISTOR

BACKGROUND OF THE INVENTION

1. Field of the Invention

The present invention relates to a thin film transistor(TFT) having an improved contact layer and a method for manufacturing the same, and more particularly to a TFT having a Si—Ge contact layer and a method for manufacturing the same.

2. Description of the Related Art

Generally, a TFT is an active element that pertains to a switching operation in a liquid crystal display. The quality of such manufactured goods depends on the current efficiency of a TFT and it is desirable to reduce resistance between the interconnecting layers in a TFT, thereby improving conductivity.

When a metal layer is formed on a semiconductor layer, contact resistance is undesirably large because of the schottky barrier generated by the different work functions in the contact region of these two layers. However, when a contact layer is formed with a heavily doped material between the semiconductor layer and the metal layer, contact resistance is reduced due to tunneling from the semiconductor layer to the contact layer.

Conventional TFTs use two types of processing to attempt to reduce contact resistance, each of which will now be described with reference to accompanying drawings.

FIG. 1 is a cross sectional view of a conventional TFT, processed with a backetch step, having a heavily doped amorphous Si contact layer. The process includes the following steps. A gate electrode 2 is formed on the central part of a transparent insulator substrate 1 by depositing and patterning a metal layer. A gate insulator layer 3 and an amorphous Si layer 4 are then successfully formed on the substrate 1 using PECVD (Plasma Enhanced Chemical Vapor Deposition) method. A contact layer 5 of a heavily doped amorphous Si ($n^+$ amorphous Si) is thereafter deposited on the semiconductor layer 4.

The contact layer 5 is formed by depositing silane ($SiH_4$), hydrogen($H_2$) and phosphine($PH_3$) using a PECVD method. The constitution ratio of $H_2$ and $SiH_4$ is 2:3. $H_2$ structurally relaxes the network of amorphous Si and reduces the number of dangling Si bonds. P of $PH_3$ reduces contact resistance if it is heavily doped.

The peripheries of contact layer 5 and the amorphous Si layer 4 for each thin film transistor are then formed by being patterned using an active mask.

Source/drain electrodes 6 and 7 are thereafter formed by depositing a metal layer which is also applied over the contact layer 5. The central part of the metal layer of the contact layer is then etched.

Thereafter, the exposed part of the contact layer 5 is back etched using the source/drain electrode pattern as a mask.

A protective layer 8 is typically formed over both the electrodes and remaining exposed portions of the semiconductor device.

In a backetch step, however, since the contact layer 5 and the semiconductor layer 4 are both made of amorphous Si, there is no selectivity when etching the central part of the contact layer 5. Therefore, precise etching that is difficult to consistently maintain is needed in order to obtain a uniform active channel in semiconductor layer 4.

FIG. 2 is a cross sectional view of a conventional TFT, processed with an etch stopper step, having a contact layer heavily doped with amorphous Si. The process is similar to the process of FIG. 1, with the exception of an etch stopper 10, made of an insulating material, being formed between a portion of the contact layer 5' and semiconductor layer 4'. This approach provides a method to etch the contact layer 5' and to obtain a uniform active channel in the semiconductor layer 4', but requires additional process steps that are undesired.

Further, when a conventional contact layer of $n^+$ amorphous Si is formed, other problems also degrade desired performance as a result of overall resistance. Although the resistance of the $n^+$ amorphous layer using a contact layer is less than the resistance generated with a direct contact of an amorphous Si layer and a source/drain electrode, lower overall resistance is desired.

Amorphous Si resistance can be reduced when the amorphous Si is microcrystallized. The conventional method for microcrystallizing amorphous Si, heavily doped in a contact layer, initially involves mixing a gas composition of $SiH_4$, $H_2$ and $PH_3$, where $H_2$ is set at more than 50 times than that of $SiH_4$. Then, the gas mixture composition is deposited on a substrate by a PECVD method. When Si atoms are deposited on the substrate, the $H_2$ constructively relaxes the amorphous Si network by substituting dangling bonds with hydrogen atoms. Unstable Si atoms, which belong to an amorphous like state, have dangling bonds, and therefore, have a bonding energy that is relatively lower than that of crystalline Si. This difference in bonding energy causes a selective etching of unstable amorphous Si atoms by colliding hydrogen radicals excited by plasma when the energy of the colliding hydrogen atom lies between that of crystalline and amorphous states. Thus, the unstable atoms are selected and etched while the microcrystallized, relatively stable, Si atoms are not etched and form a microcrystallized Si layer.

Although the above-mentioned method for microcrystallizing a highly doped contact layer can reduce the resistance of the amorphous Si, it has problems as well. Specifically, while the contact resistance in the contact region of the two electrodes with the top upper surface of the contact layer can be reduced, there is less crystallinity and poor etching selectivity in the contact region of the bottom lower surface of the contact layer with the amorphous Si layer. During the process of Si atom deposition, the statistical probability of finding a crystalline site by attaching Si atoms at the early stage of the deposition is relatively lower than that at the final stage. Thus, contact resistance continues to adversely affect device performance.

SUMMARY OF THE INVENTION

In order to resolve the above-mentioned problems, it is an object of the present invention to improve etching selectivity when etching a semiconductor layer and a contact layer disposed above it by forming a contact layer of Si—Ge.

To achieve this object, according to the present invention, a contact layer used in a TFT to improve electrical contact between a semiconductor layer and a metal electrode is formed by depositing a gas mixture composition of $GeH_4$, $SiH_4$, $H_2$ and $PH_3$. Thus, a contact layer is formed between the semiconductor and the metal electrode and is made of doped Ge and Si.

The effect of a TFT having a Ge—Si contact layer is that a stable etching of the contact layer, without excessive etching of the semiconductor layer can be made due to a good selectivity when etching. Consequently, a uniform active channel after a backetch step is obtained and the device performance can be improved.

DETAILED DESCRIPTION OF THE PREFERRED EMBODIMENTS

The preferred embodiment of the present invention will now be described with reference to the accompanying drawings.

According to the preferred embodiment of the present invention, a contact layer that is a microcrystallized and heavily doped Si—Ge layer connects the amorphous Si and the source/drain electrodes.

Since the generation ratio of dangling bonds of Ge atoms is generally higher than that of Si atoms, the transitionality of Ge atoms is lower than that of Si atoms. However, Ge atoms in a crystal state have a higher mobility. In addition, it is easier to etch Ge than to etch Si.

The method of depositing an amorphous Ge by a PECVD method is the same as that of depositing amorphous Si. Particularly, producing amorphous Ge uses the same sequence as the production of amorphous Si. In the case of an amorphous Si, silane is mixed into the gas mixture composition through a Si gas tube. Similarly, amorphous Ge is produced by mixing germane into the gas mixture composition of hydrogen and phosphine through a Ge gas tube. Also, the method of a depositing microcrystallized Ge is same as that of microcrystallized Si.

However, it is not simple to etch amorphous Ge since the colliding momentum of $H_2$ atoms is not sufficient to detach Ge due to its bonding energy and atomic mass. Consequently, it is more difficult to microcrystallize Ge than to microcrystallize Si. Therefore, when forming a Si—Ge layer, the ratio of Ge gas in the mixing gases should be set lower than that of the resulting Si—Ge layer formed on a substrate. In this regard, preferably the quantity of germanium gas should be precisely controlled.

According to "Selective Removal of a $Si_{0.7}Ge_{0.3}$ Layer from Si{100}" Applied Physics Letter, Vol 58, No.17 issued on Apr. 29, 1991, there is a 13:1 resulting ratio of $Si_{0.7}Ge_{0.3}$ and Si{100} using etching solution of $HNO_3:H_2O:HF$, mixed with a ratio of 40:20:5 at 34° C. Thus, the etching ratio of a Si—Ge layer can be higher than that of a Si layer. According to the preferred embodiment of the present invention, an amorphous Si—Ge contact layer is formed considering the above-mentioned facts.

FIGS. 3A to 3E are cross sectional views illustrating a process of forming a TFT of an amorphous silicon according to the preferred embodiment of the present invention.

Figure 3A:
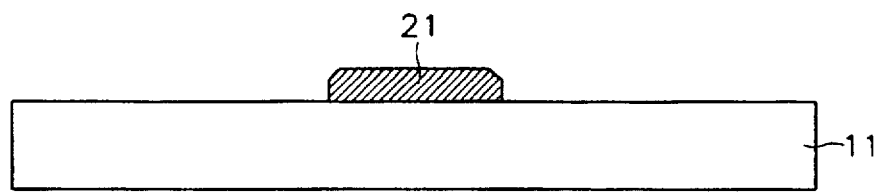
FIGS. 3A–3E are cross sectional views of a TFT construction in sequential process according to the preferred embodiment of the present invention.
Figure 3B:
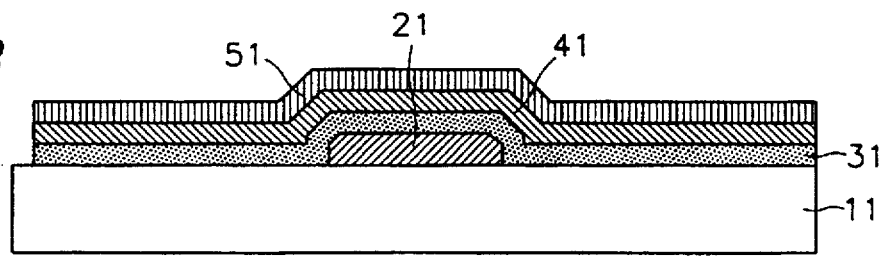

Referring to FIG. 3A, a layer of metal material, such as alumina and/or chrome is deposited and a gate electrode 21 is formed on a substrate 11 using a gate mask. Then, as shown in FIG. 4B, after a gate insulator layer 31 and an amorphous Si layer 41 are sequentially deposited above the substrate 11 by a PECVD method, a microcrystallized amorphous $n^+$ Si—Ge contact layer 51 is formed by depositing a gas mixture of $H_2$, $PH_3$, $SiH_4$ and $GeH_4$ by a PECVD method. In this step, the mass of $H_2$ is set at least 50 times greater than that of the silane ($SiH_4$) for the efficient microcrystallization of Si and Ge. Preferably, the concentration of Ge is set to less than about 0.5% of the gas mixture considering the nature of Ge and the ratio of Si to Ge deposited in this layer is 7:3. Preferably, the quantity of Ge is set so that it is not more than 1/20 of the silane quantity, since the ratio of Ge being deposited is higher than that of Si.

Figure 3C:
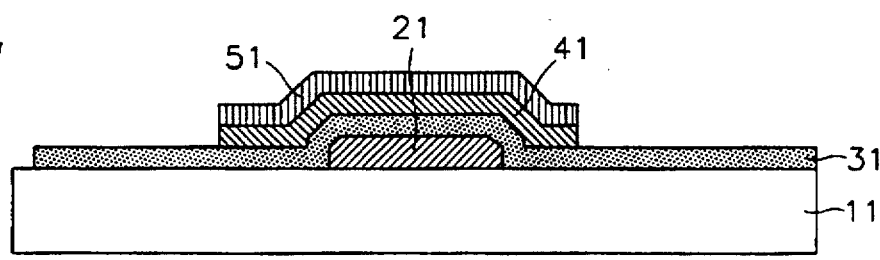

Thereafter, as shown in FIG. 3C, the $n^+$ Si—Ge contact layer 51 and amorphous Si layer are patterned using an active mask.

Figure 3D:
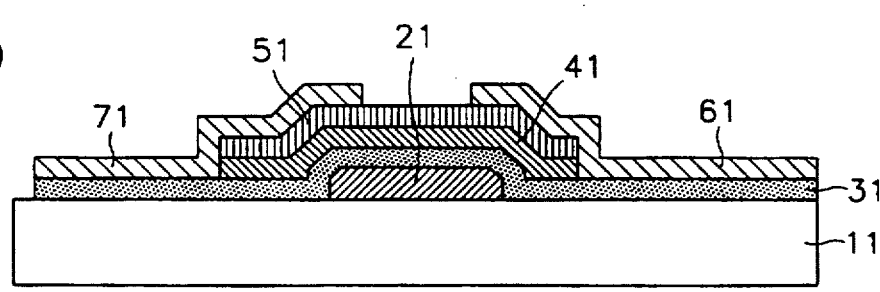

In FIG. 3D, a metal layer is deposited on the substrate 11 and a source electrode 61 and a drain electrode 71 for each thin film transistor are patterned so that a surface portion of contact layer 51 that corresponds to the location of a gate electrode 21 is exposed.

Figure 3E:
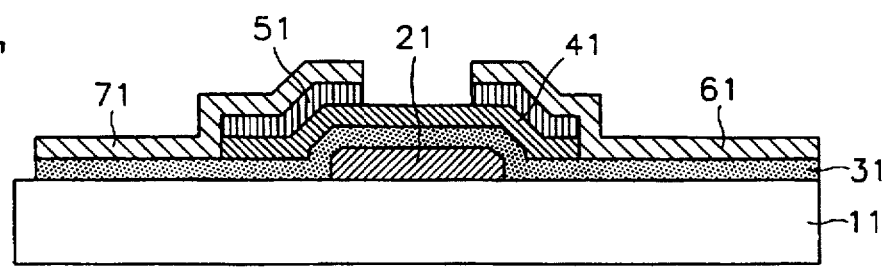

In FIG. 3E, the contact layer 51 is etched using the source electrode 61 and the drain electrode 71 as a mask to expose a surface of the amorphous Si layer 41. In this etching step, a mixture of $HNO_3$, $H_2O$ and HF is used as an etching solution in order to induce good selectivity between the contact layer 51 and the amorphous Si layer 41.

Figure 1:
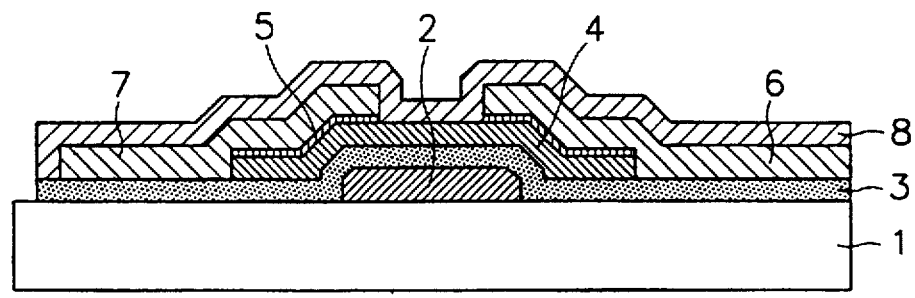
FIGS. 1 and 2 are cross sectional views of conventional TFTs, processed with a backetch step and an etch stopper step respectively, having a heavily doped amorphous Si layer.
Figure 2:
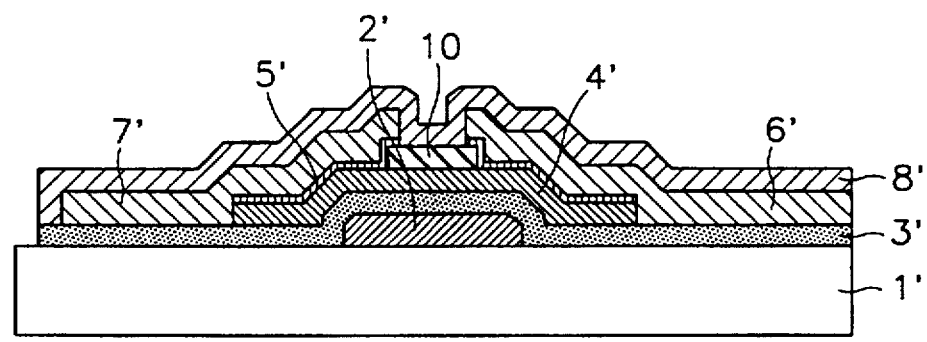
Figure 4:
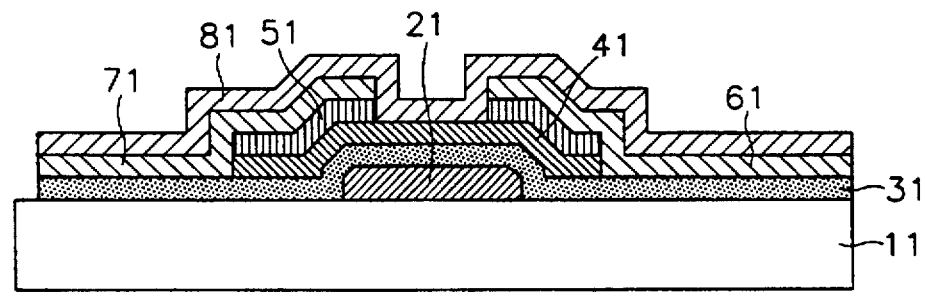
FIG. 4 is a cross sectional view illustrating a resulting TFT.

FIG. 4 is a cross sectional view of a resulting TFT according to the preferred embodiment of the present invention. As shown in FIG. 4, a protective layer 81 is formed over the entire semiconductor device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A thin film transistor, comprising:

a substrate;

a gate electrode formed on the substrate;

a gate insulating layer covering the gate electrode;

an amorphous silicon layer deposited on the gate insulating layer;

a contact layer formed of a doped amorphous silicon-germanium deposited on the amorphous silicon layer; and a source/drain electrode formed on the contact layer.

2. A thin film transistor according to claim 1, wherein the silicon and germanium of said contact layer are microcrystalized.

3. A thin film transistor according to claim 1, wherein the germanium in said contact layer is less than one-third of the silicon in the contact layer.

4. A thin film transistor according to claim 1, wherein the germanium and silicon are contained in said contact layer in a 3:7 ratio respectively.

* * * * *